(12) United States Patent
Suzuki

(10) Patent No.: US 7,265,606 B1
(45) Date of Patent: Sep. 4, 2007

(54) APPARATUS AND METHOD FOR A BOOT STRAP CIRCUIT FOR A BOOST VOLTAGE CONVERTER

(75) Inventor: Hidehiko Suzuki, Tokyo (JP)

(73) Assignee: National Semiconductor Corporation, Santa Clara, CA (US)

( * ) Notice: Subject to any disclaimer, the term of this patent is extended or adjusted under 35 U.S.C. 154(b) by 1 day.

(21) Appl. No.: 10/933,813

(22) Filed: Sep. 2, 2004

(51) Int. Cl.
*H03K 17/16* (2006.01)
*G05F 1/10* (2006.01)

(52) U.S. Cl. ............ 327/536; 327/589; 327/390

(58) Field of Classification Search ........... 327/390, 327/589, 536–537
See application file for complete search history.

(56) References Cited

U.S. PATENT DOCUMENTS

| | | | |
|---|---|---|---|
| 6,242,970 B1 * | 6/2001 | Grant et al. | 327/536 |
| 6,486,729 B2 * | 11/2002 | Imamiya | 327/536 |
| 6,559,689 B1 * | 5/2003 | Clark | 327/97 |
| 6,738,272 B2 * | 5/2004 | Yamanaka et al. | 363/60 |
| 2002/0014908 A1 * | 2/2002 | Lauterbach | 327/536 |

\* cited by examiner

*Primary Examiner*—Dinh T. Le
(74) *Attorney, Agent, or Firm*—Darby & Darby, P.C.; Matthew M. Gaffney (57) ABSTRACT

A boost converter with a flying capacitor topology is provided. The flying capacitor is charged during a first half of a cycle. During a second half of the cycle, the output voltage of the boost converter is supplied from Vdd until the output voltage approximately reaches Vdd. At that point, the flying capacitor is used to provide the output voltage.

24 Claims, 6 Drawing Sheets

Figure 4A $V_g = 0$, $V_d = VDD$

Figure 4B

$V_g = VDD$, $V_d = 0$

Figure 4C
$V_g$ = VDD + $V_{odrv}$, $V_d$ = 0

Figure 5A
$V_g$ = 0, $V_d$ = VDD

Figure 5B $V_g = VDD, V_d = 0$

Figure 5C $V_g = VDD + V_{odrv}, V_d = 0$

APPARATUS AND METHOD FOR A BOOT STRAP CIRCUIT FOR A BOOST VOLTAGE CONVERTER

FIELD OF THE INVENTION

The invention is related to voltage converter circuits, and in particular, to a boost converter circuit with bootstrapping.

BACKGROUND OF THE INVENTION

Typically, supply power for a driver for a power device is delivered from the system power supply rail. However, in some cases, a drive voltage greater than the power supply rail may be needed to decrease the on-resistance of the power device. A booster voltage converter (such as a charge pump) may be employed to provide a voltage that is greater than the power supply voltage.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a boost converter with a flying capacitor topology. The flying capacitor is charged during a first half of a cycle. During a second half of the cycle, the output voltage of the boost converter is supplied from Vdd until the output voltage approximately reaches Vdd. Then, the flying capacitor is used to provide the output voltage.

Figure 1:
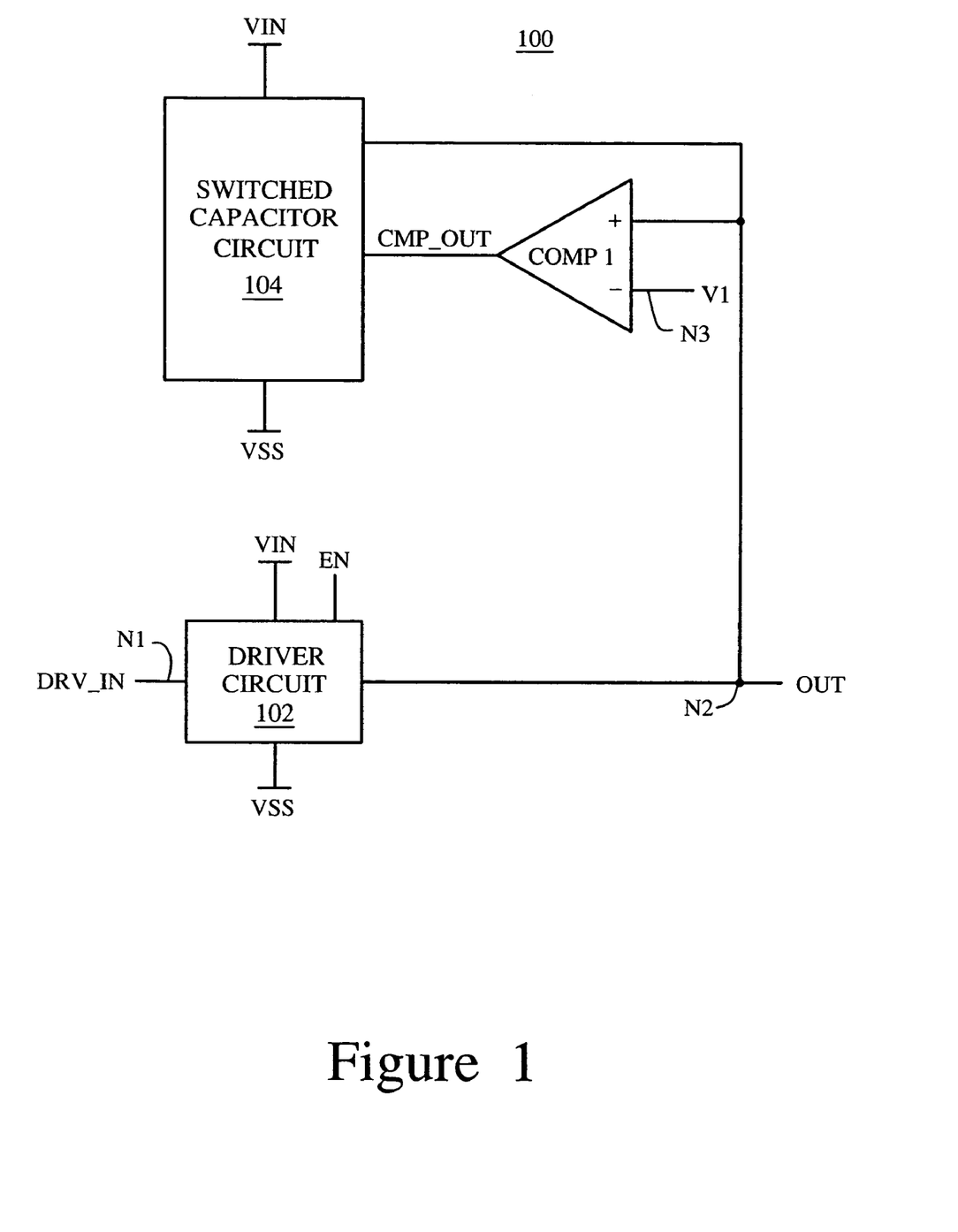
FIG. 1 illustrates a block diagram of an embodiment of a boost converter circuit.

FIG. 1 illustrates a block diagram of an embodiment of boost converter circuit 100. Boost converter circuit 100 is arranged to convert input voltage VIN into output signal OUT. Boost converter circuit 100 includes driver circuit 102, switched capacitor circuit 104, and comparator circuit comp1.

In one embodiment, driver circuit 102 is arranged to tri-state if signal EN corresponds to an inactive logic level. Further, in this embodiment, driver circuit 102 is arranged to provide a signal at node N2 if signal EN corresponds to the active logic level. In another embodiment, whether driver circuit 102 tri-states is further based on driver input signal DRV_IN.

In one embodiment, if signal EN corresponds to the active logic level, driver circuit 102 provides output signal OUT at the same logic level as signal DRV_IN. In another embodiment, if signal EN corresponds to an active level, driver circuit 102 provides signal OUT at the inverse logic level of signal DRV_IN.

Additionally, comparator circuit comp1 is arranged to compare signal OUT with comparison signal V1, and to provide comparison output signal CMP_OUT in response to the comparison.

In one embodiment, signal DRV_IN is a clock signal, or the like, that corresponds to a first logic level and a first half of a cycle, and corresponds to a second logic level during a second half of the cycle.

During the first half of the cycle, switched capacitor circuit 104 charges a capacitor (not shown in FIG. 1) in switched capacitor circuit 104. During the second half of the cycle, driver circuit 102 continues to drive node N2 as long as signal COMP_OUT remain inactive. However, substantially when comparator circuit comp1 trips, the charged capacitor in switched capacitor circuit 104 drivers node OUT, and signal EN changes to an inactive logic level. Further, the voltage of comparison signal V1 may be provided as approximately equal to voltage VIN.

Accordingly, signal OUT is supplied to voltage VIN via driver circuit 102 until signal OUT approximately reaches VIN. At this point, signal OUT is provided from switched capacitor circuit 104.

In one embodiment, the voltage of signal V1 is slightly less than voltage VIN.

Figure 2:
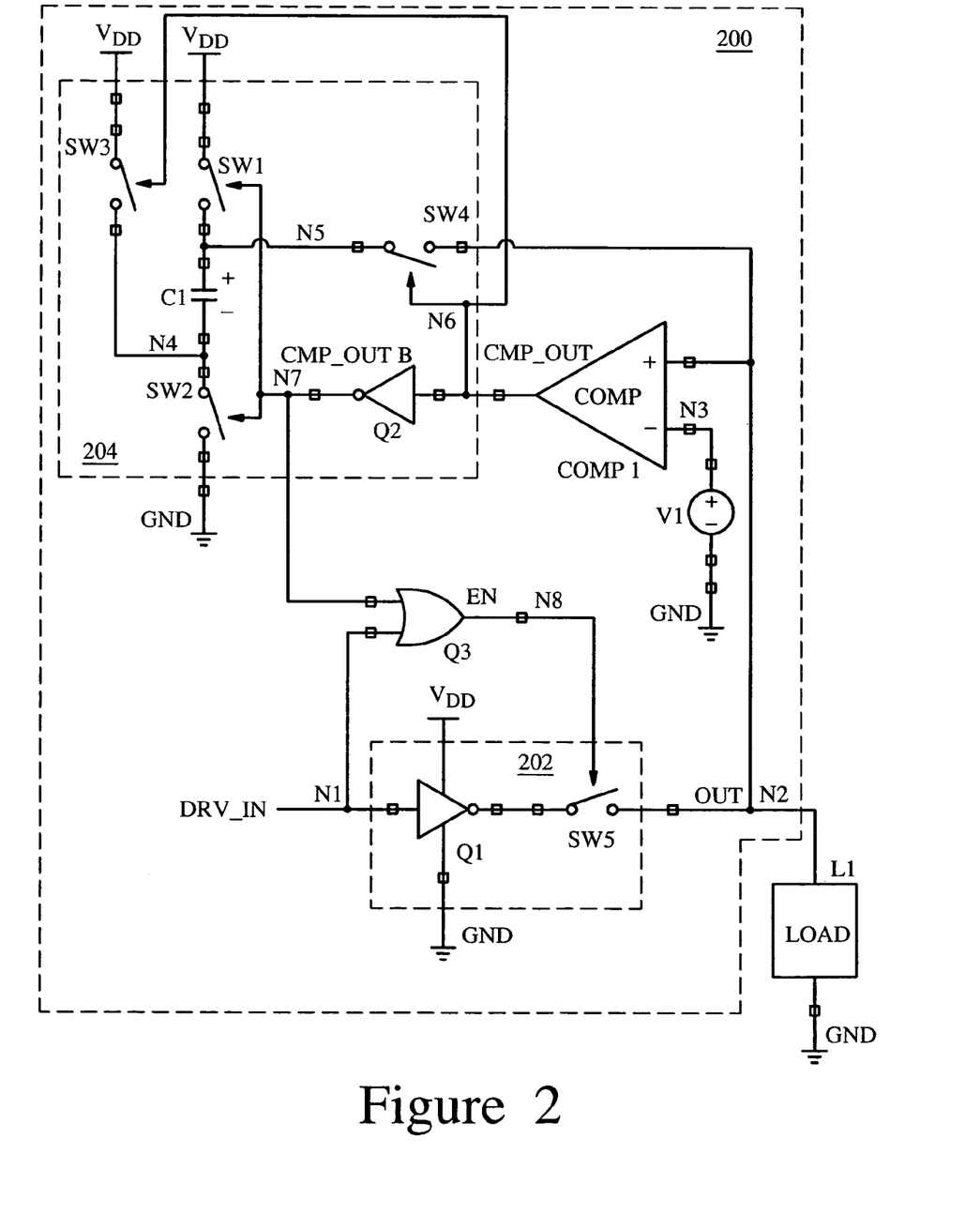
FIG. 2 shows a block diagram of an embodiment of the boost converter circuit of FIG. 1 and a load.

FIG. 2 shows a block diagram of an embodiment of boost converter circuit 200 and load L1. Components in boost converter circuit 200 are arranged to operate in a substantially similar manner to similarly-named components in boost converter circuit 100 of FIG. 1, and may operate in a different manner in some ways. Booster converter circuit 200 further includes OR gate Q3. Driver circuit 202 includes inverter circuit Q1 and switch circuit SW5. Switched capacitor circuit 204 includes capacitor circuit C1, switch circuits SW1-SW4, and inverter circuit Q2. In FIG. 2, voltage VDD is employed as an embodiment of voltage VIN.

FIG. 2 illustrates embodiments of switch circuits that are closed when their control input is high, and open when their control input is low. However, in other embodiments, one or more of switch circuits SW1-SW5 may be closed when their control input is low, rather than high. In this case, the control signal provided to the switch circuit may be the inverse of the signal shown in FIG. 2.

Inverter circuit Q2 is arranged to provide signal CMP_OUTB from signal COMP_OUT. Switch circuits SW1 and SW2 are each arranged to open and close responsive to signal COMP_OUTB. Conversely, switch circuits SW3 and SW4 are each arranged to open and close responsive to signal CMP_OUT.

OR gate Q3 is arranged to provide signal EN from signals COMP_OUTB and DRV_IN. Additionally, switch circuit SW5 is arranged to open and close responsive to signal EN. In one embodiment, switch circuits SW1-SW5 are each a field effect transistor (FET). Load L1 is arranged to be driven by signal OUT. In one embodiment, load L1 is a switching load.

During the first half of the cycle, signal DRV_IN is high, and signal OUT is low accordingly. Also, signal COMP_OUT is low and signal COMP_OUTB is high. Accordingly, switch circuits SW1 and SW2 are closed, and switch circuits SW3 and SW4 are open. The voltage at node N5 is substantially equal to Vdd, and voltage at node N4 is substantially at ground. Accordingly, capacitor circuit C1 is charged to Vdd while signal DRV_IN is high.

At the second half of the cycle, signal DRV_IN changes to low, and signal OUT accordingly changes to high and drives load L1 high. Until signal OUT reaches voltage V1, the energy to load L1 is supplied through inverter circuit Q1, which employs Vdd as its supply rail, and charge from C1 is not transferred to the load. However, when signal OUT reaches voltage V1, the comparator trips. At this point, signal COMP_OUT changes to high and signal COMP_OUTB changes to low. Accordingly, switch circuits SW1, SW2, and SW5 open, and switch circuits SW3 and SW4 close, so that node N4 is coupled to Vdd, and node N5 is coupled to node N2.

Accordingly, the voltage at node N5 is pulled up to substantially $2*Vdd$ through capacitor circuit C1, as is signal OUT. The charge from capacitor circuit C1 is only used at node N2 to move from voltage V1 to $2*Vdd$. Accordingly, the required capacitance (for a given voltage of signal OUT) for capacitor circuit C1 may be less than the required capacitance for conventional switched-capacitor boost converter topologies.

Figure 3:
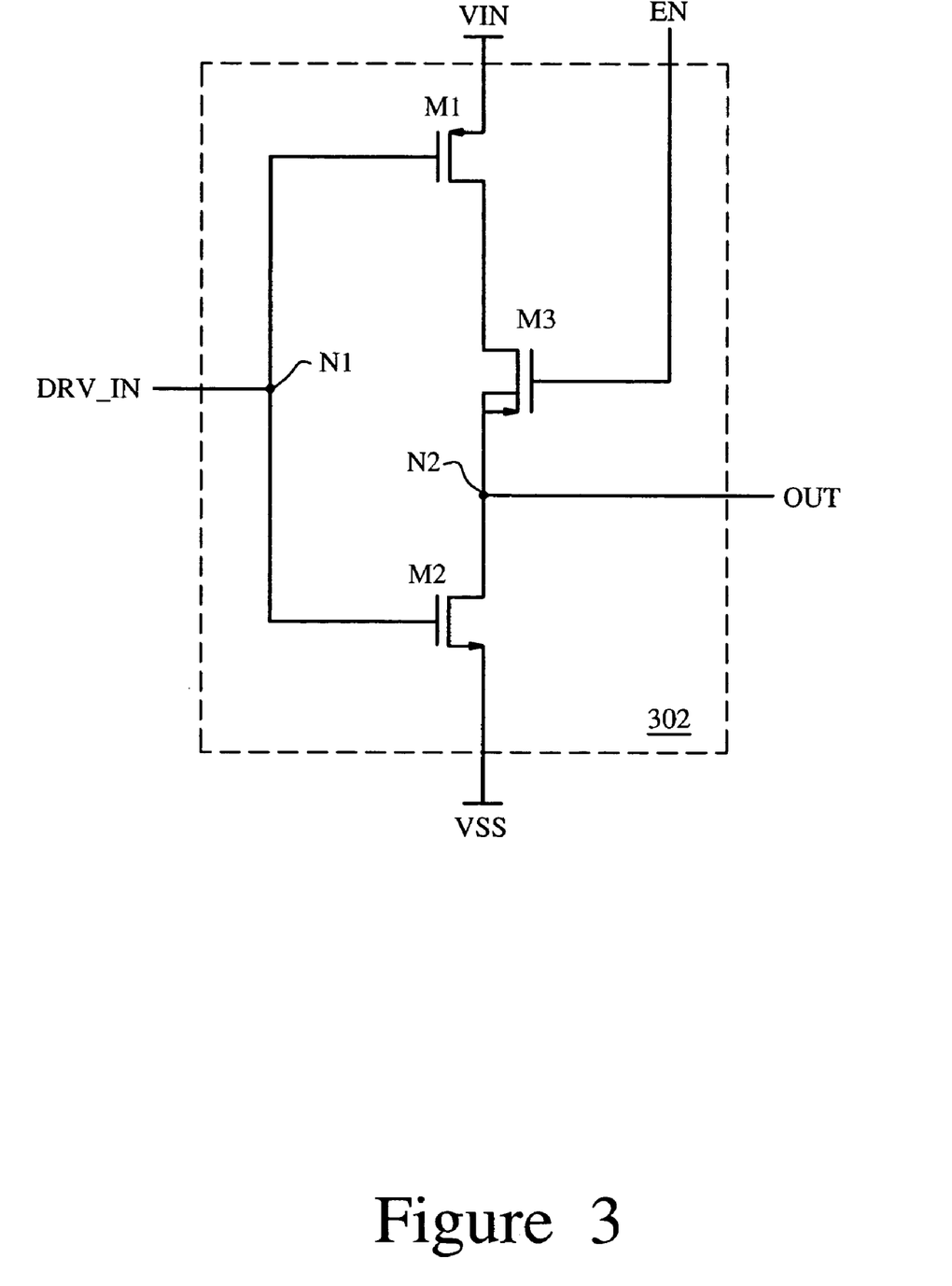
FIG. 3 schematically illustrates an embodiment of the driver circuit of FIG. 1.

FIG. 3 schematically illustrates an embodiment of driver circuit 302. Driver circuit 302 is an embodiment of driver circuit 102 of FIG. 1. Driver circuit 302 includes transistors M1-M3. Driver circuit 102 is similar to a conventional CMOS inverter, except for the presence of transistor M3. If signal EN corresponds to an active logic level (low, in this embodiment), driver circuit 302 operates as an inverter. However, if signal EN corresponds to an inactive logic level and signal DRV_IN is low, driver circuit 302 is substantially tri-stated, so that node N1 is substantially de-coupled from node N2.

Figure 4A:
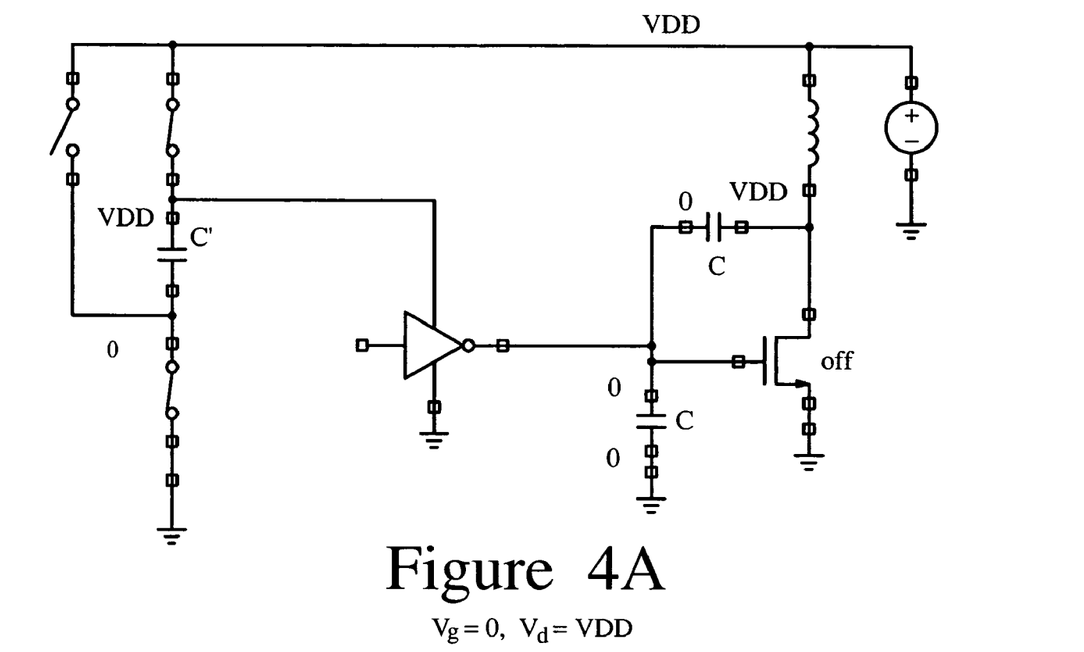
FIGS. 4a-4c show a schematic diagram of a model of a boost converter and a switching load.
Figure 4B:
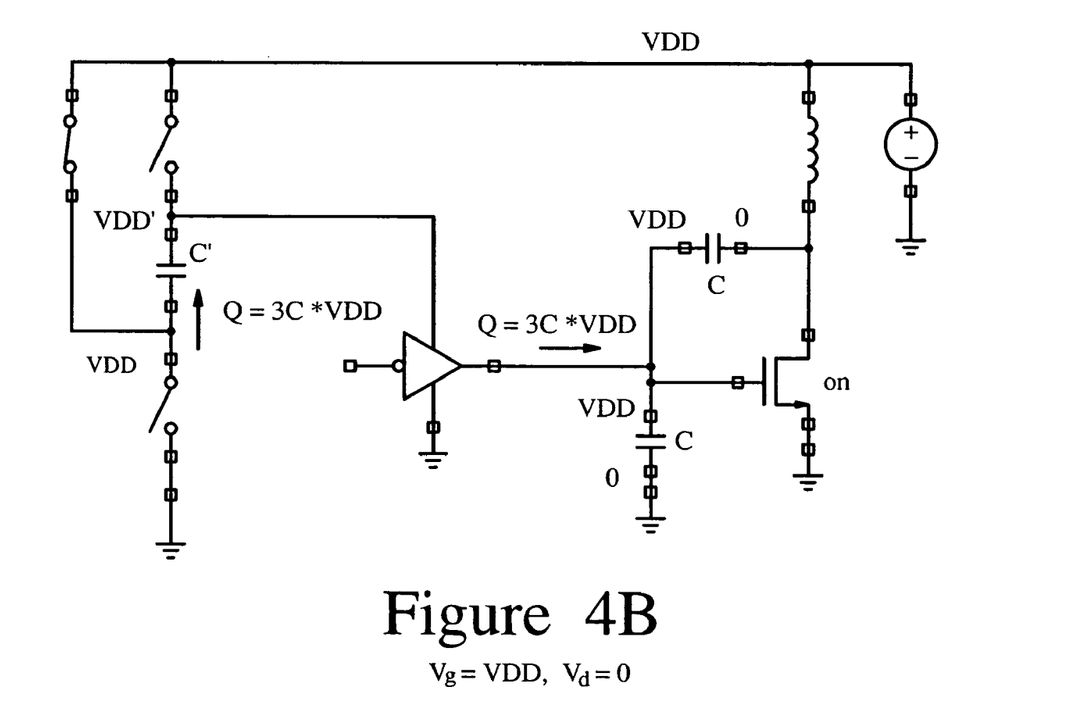
Figure 4C:
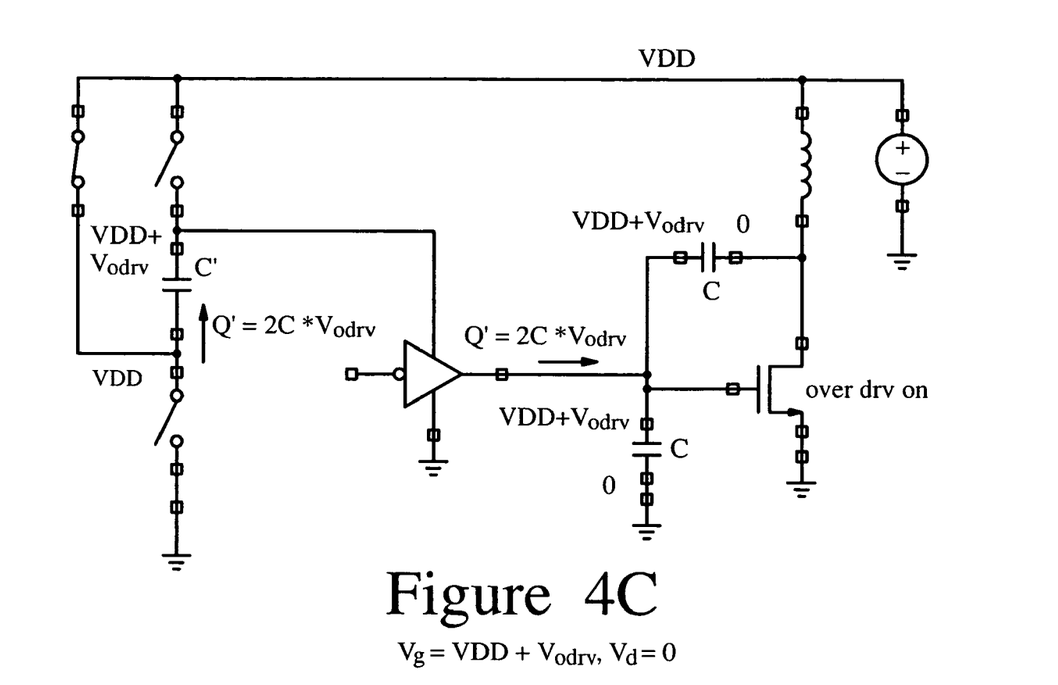
Figure 5A:
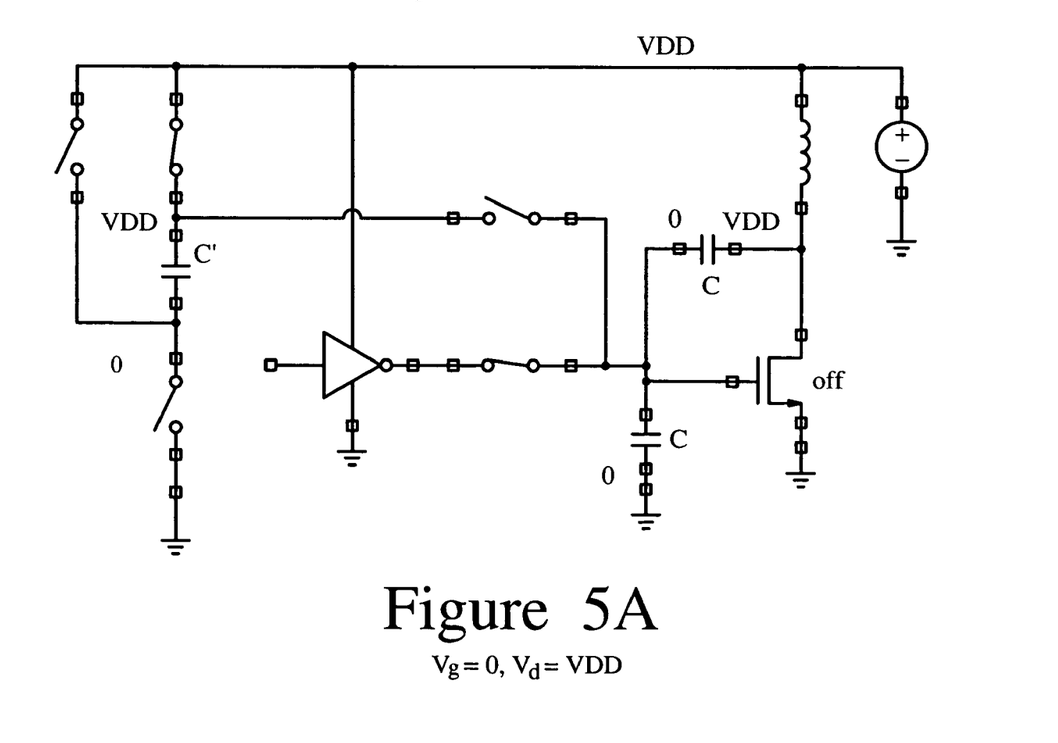
FIGS. 5a-5c schematically illustrate an embodiment of another model of a boost converter and a switching load, in accordance with aspects of the invention.
Figure 5B:
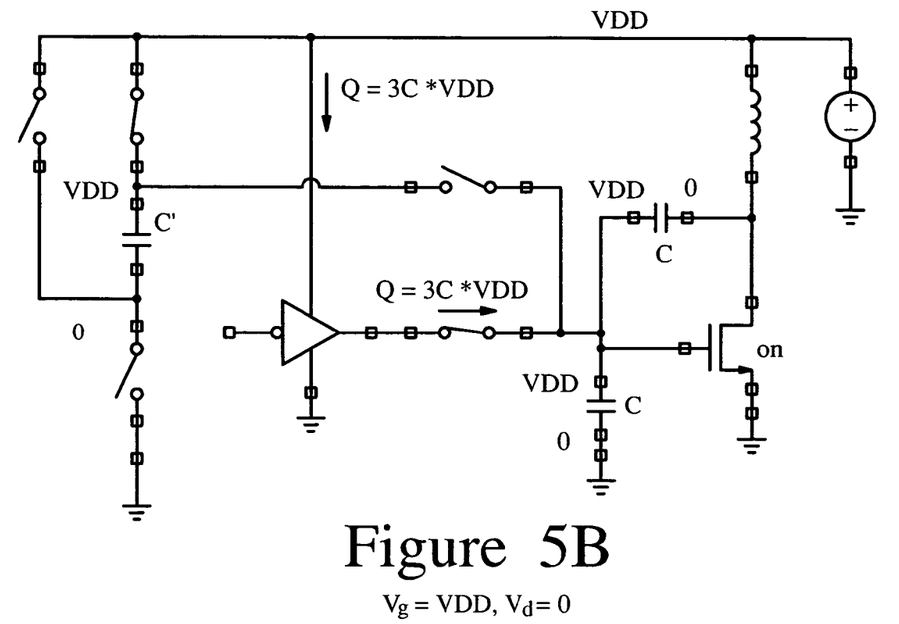
Figure 5C:
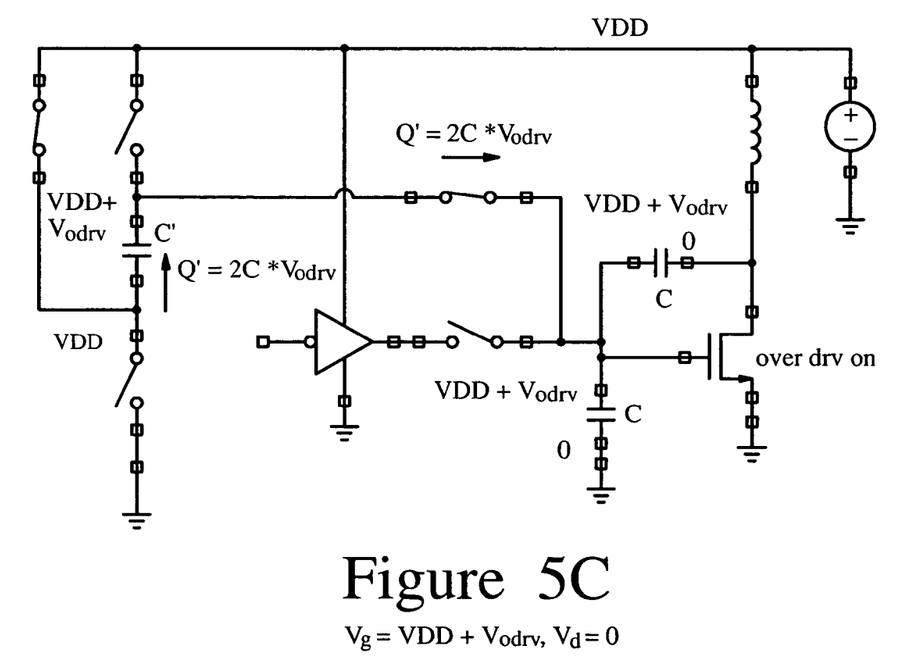

FIGS. 4a-4c show a schematic diagram a model of a boost converter and a switching load. FIGS. 5a-5c schematically illustrate an embodiment of a model of a boost converter and a switching load in which a required capacitance is reduced in accordance with aspects of the present invention.

For each of FIGS. 4a-4c and 5a-5c, a switching load is represented as a MOSFET with a parasitic capacitance of C between the gate and the drain, a parasitic capacitance C between the gate and the source, and an inductor, where it is assumed that the gate-to-source and gate-to-drain parasitic capacitances of the MOSFET are substantially equal.

FIG. 4a shows the state for a model of the boost converter and load at the beginning of the first half of the cycle, where the gate voltage of the MOSFET is 0V. FIG. 4b shows the state for the model when the voltage at the gate node of the MOSFET is Vdd. A transferred charge of $3C*Vdd$ is required to pull the gate node of the MOSFET from 0 to Vdd and the drain node of the MOSFET from VDD to 0V. The energy for the charge transfer is supplied from the flying capacitor.

FIG. 4c shows the state for the model of FIG. 4c at the end of the second half of the cycle. A charge of $2C*Vodrv$ is required to pull the gate node of the MOSFET from Vdd to Vdd+Vodrv. For FIGS. 4a-4c, the energy required to drive the load to Vdd+Vodrv is $3C*Vdd+2C*Vodrv$, all of which is supplied through the charge from the flying capacitor. If Vodrv=Vdd, the transferred energy from the flying capacitor is $5C*Vdd$.

FIG. 5a shows the state for a model of a boost converter and load at the beginning of the first half of the cycle, where the gate voltage of the MOSFET is 0V. FIG. 5b shows the state for the model of FIG. 5a when the voltage at the gate node of the MOSFET is Vdd. A transferred charge of $3C*Vdd$ is required to pull the gate node of the MOSFET from 0 to Vdd and the drain node of the MOSFET from VDD to 0V. The energy for the charge transfer is supplied directly from the Vdd rail.

FIG. 5c shows the state for the model of FIG. 5c at the end of the second half of the cycle. A charge of $2C*Vodrv$ is required to pull the gate node of the MOSFET from Vdd to Vdd+Vodrv. For FIGS. 5a-5c, the energy required to drive the load to Vdd+Vodrv is $3C*Vdd+2C*Vodrv$, of which $2C*Vodrv$ is supplied by the flying capacitor. If Vodrv=Vdd, the transferred energy from the flying capacitor is $2C*Vdd$. This is $2/5$ of the energy transferred for the case illustrated in FIGS. 4a-4c.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A boost converter circuit, comprising:
a driver circuit that is arranged to drive an output node if the driver circuit is enabled, wherein the driver circuit is arranged to receive a power supply voltage;
a comparator circuit that is arranged to provide a comparator output signal based on a comparison of an output voltage at the output node and a comparison voltage, wherein the comparison voltage is approximately equal to the power supply voltage;
a capacitor circuit; and
a plurality of switch circuits that are arranged to couple the capacitor circuit to the power supply voltage if the comparator output signal corresponds to a first logic level, and further arranged to couple the capacitor circuit to the output node if the comparator output signal corresponds to a second logic level.

2. The boost converter circuit of claim 1, wherein the boost converter circuit is arranged to drive a switching load.

3. The circuit of claim 1, wherein the driver circuit is arranged such that the driver circuit is enabled if the output voltage is approximately less than the power supply voltage, and such that the driver is tri-stated if the output voltage is approximately greater than the power supply voltage.

4. The circuit of claim 1, wherein the comparison voltage is slightly less than the power supply voltage.

5. The circuit of claim 1, wherein the plurality of switch circuits includes first, second, third, and fourth switch circuits; the capacitor circuit is coupled between a first capacitor node and a second capacitor node; the first switch circuit is coupled between the first capacitor node and a power supply node; the second switch circuit is coupled to the second capacitor node; the third switch circuit is coupled between the second capacitor node and the power supply node; and wherein the fourth capacitor node is coupled between the first capacitor node and the output node.

6. The circuit of claim 5, wherein the third and fourth switch circuits are each arranged to be open if the comparator output signal corresponds to the first logic level and closed if the comparator output signal corresponds to the second logic level; and wherein the first and second switch circuit are each arranged to be closed if the comparator output signal corresponds to the first logic level, and open if the comparator output signal corresponds to the second logic level.

7. A boost converter circuit, comprising:
a tri-state driver circuit including an input, an output that is coupled to an output node, a supply voltage input, and an enable input;
a comparator circuit including a first input, a second input, and an output, wherein the first input of the comparator circuit is coupled to the output node;
a first switch circuit coupled to said supply voltage input;
a second switch circuit;
a capacitor circuit that is coupled between the first and second switch circuits;
a third switch circuit coupled to said supply voltage input including a control input that is coupled to the output of the comparator circuit, wherein the third switch circuit is coupled to the capacitor circuit and the second switch circuit; and
a fourth switch circuit including a control input that is coupled to the output of the comparator circuit, wherein the fourth switch circuit is coupled between the capacitor circuit and the output node.

8. The boost converter circuit of claim 7, wherein the tri-state driver circuit includes an inverter that is configured to tri-state based, in part, on a signal provided at the enable input.

9. The boost converter circuit of claim 7, wherein the first, second, third, and fourth switch circuits each include a control input that is coupled to the output of comparator circuit.

10. The boost converter circuit of claim 7, wherein the supply voltage input of the driver circuit is coupled to a supply node that is arranged to receive an input voltage.

11. The boost converter circuit of claim 10, wherein the capacitor circuit is coupled between a first capacitor node and a second capacitor node, the first switch circuit is coupled between the first capacitor node and a power supply node, the second switch circuit is coupled to the second capacitor node, the third switch circuit is coupled between the second capacitor node and the power supply node, and wherein the fourth capacitor node is coupled between the first capacitor node and the output node.

12. The boost converter circuit of claim 10, wherein the tri-state driver circuit is arranged to drive the output node if the tri-state driver circuit is enabled, and further arranged to tri-state if the tri-state driver circuit is disabled.

13. The boost converter circuit of claim 12, wherein the tri-state driver circuit is arranged to receive, at the enable input, an enable signal that is based, in part, on an output voltage at the output node such that the tri-state driver circuit is tri-stated if the output voltage approximately exceeds reaches the input voltage.

14. The boost converter circuit of claim 10, wherein the comparator circuit is arranged to receive, at the second input of the comparator circuit, a comparison voltage that is approximately equal to the input voltage, and wherein the comparator circuit is arranged to provide a comparison output signal at the output of the comparator circuit based on a comparison of the comparison voltage and an output voltage at the output node.

15. The boost converter circuit of claim 14, wherein the third and fourth switch circuits are each arranged to be open if the comparator output signal corresponds to a first logic level and closed if the comparator output signal corresponds to a second logic level; and wherein the first and second switch circuit are each arranged to be closed if the comparator output signal corresponds to the first logic level, and open if the comparator output signal corresponds to the second logic level.

16. A method for providing an output voltage, comprising:
providing a clock signal to an input of a driver circuit;
providing an input voltage to a power supply input of the driver circuit;
comparing an output voltage at an output node with a comparison voltage to provide a comparison signal;
selectively coupling the output of the driver circuit to the output node when the comparison signal is at a first level; and
selectively coupling a capacitor circuit to the output node when the comparison signal is at a second level.

17. The method of claim 16, wherein the comparison voltage is approximately equal to the input voltage.

18. The method of claim 16, further comprising charging the capacitor circuit by coupling the capacitor circuit to the input voltage.

19. The method of claim 16, wherein selectively coupling the output of the driver circuit to the output node includes enabling the driver circuit when the comparison circuit is at the first level, and tri-stating the driver circuit when the comparison signal at the second level.

20. The method of claim 16, wherein selectively coupling a capacitor circuit to the output node when the comparison signal is at a second level includes:
tri-stating the driver circuit;
substantially de-coupling the capacitor circuit from the input voltage; and
coupling the capacitor circuit to the output node.

21. A boost converter circuit, comprising:
a driver circuit that is arranged to drive an output node if the driver circuit is enabled, wherein the driver circuit is arranged to receive an input voltage;
a comparator circuit that is arranged to provide a comparator output signal based on a comparison of an output voltage at the output node and a comparison voltage, wherein the comparison voltage is approximately equal to the input voltage;
a capacitor circuit; and
a plurality of switch circuits that are arranged to couple the capacitor circuit to the input voltage if the comparator output signal corresponds to a first logic level, and further arranged to couple the capacitor circuit to the output node if the comparator output signal corresponds to a second logic level, wherein the driver circuit is arranged to receive a clock signal, and wherein the driver circuit is arranged to drive the output node based on the clock signal such that the output voltage periodically alternates between a low voltage and a high voltage.

22. A boost converter circuit, comprising:
a driver circuit that is arranged to drive an output node if the driver circuit is enabled, wherein the driver circuit is arranged to receive an input voltage;

a comparator circuit that is arranged to provide a comparator output signal based on a comparison of an output voltage at the output node and a comparison voltage, wherein the comparison voltage is approximately equal to the input voltage;

a capacitor circuit;

a plurality of switch circuits that are arranged to couple the capacitor circuit to the input voltage if the comparator output signal corresponds to a first logic level, and further arranged to couple the capacitor circuit to the output node if the comparator output signal corresponds to a second logic level, and a logic gate, wherein the driver circuit has at least a power supply input that is arranged to receive the input voltage, an input that is arranged to receive a clock signal, an enable input that is arranged to receive an enable signal, and an output that is coupled to the output node; and wherein the logic gate is arrange to provide the enable signal such that:

if the output voltage is approximately greater than the input voltage and the enable signal correspond to a first logic level:

the driver circuit is tri-stated;

else the driver circuit is enabled.

23. A boost converter circuit, comprising:

a tri-state driver circuit including an input, an output that is coupled to an output node, a supply voltage input, and an enable input;

a comparator circuit including a first input, a second input, and an output, wherein the first input of the comparator circuit is coupled to the output node;

a first switch circuit;

a second switch circuit;

a capacitor circuit that is coupled between the first and second switch circuits;

a third switch circuit including a control input that is coupled to the output of the comparator circuit, wherein the third switch circuit is coupled to the capacitor circuit and the second switch circuit; and a fourth switch circuit including a control input that is coupled to the output of the comparator circuit, wherein the fourth switch circuit is coupled between the capacitor circuit and the output node, wherein the tri-state driver circuit is arranged to receive a clock signal at the input of the tri-state driver circuit.

24. A boost converter circuit, comprising:

a tri-state driver circuit including an input, an output that is coupled to an output node, a supply voltage input, and an enable input;

a comparator circuit including a first input, a second input, and an output, wherein the first input of the comparator circuit is coupled to the output node;

a first switch circuit;

a second switch circuit;

a capacitor circuit that is coupled between the first and second switch circuits;

a third switch circuit including a control input that is coupled to the output of the comparator circuit, wherein the third switch circuit is coupled to the capacitor circuit and the second switch circuit;

a fourth switch circuit including a control input that is coupled to the output of the comparator circuit, wherein the fourth switch circuit is coupled between the capacitor circuit and the output node; and a logic gate having at least a first input that is coupled to the input of the tri-state driver circuit, a second input that is coupled to the output of the comparator circuit, and an output that is coupled to the enable input of the tri-state driver circuit.

* * * * *